(12) United States Patent
Lee (10) Patent No.: US 10,077,191 B2
(45) Date of Patent: Sep. 18, 2018

(54) DEVICES FOR CARBON NANOTUBE LENGTH CONTROL

(71) Applicant: KOREA UNIVERSITY RESEARCH AND BUSINESS FOUNDATION, Seoul (KR)

(72) Inventor: Kwangyeol Lee, Namyangju-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 605 days.

(21) Appl. No.: 14/813,687

(22) Filed: Jul. 30, 2015

(65) Prior Publication Data

US 2015/0336798 A1  Nov. 26, 2015

Related U.S. Application Data

(62) Division of application No. 12/648,110, filed on Dec. 28, 2009, now Pat. No. 9,126,836.

(51) Int. Cl.
| | |
|---|---|
| *C01B 32/176* | (2017.01) |
| *C01B 31/02* | (2006.01) |
| *H01J 37/32* | (2006.01) |
| *B82Y 30/00* | (2011.01) |
| *B82Y 40/00* | (2011.01) |

(Continued)

(52) U.S. Cl.
CPC ............ *C01B 31/028* (2013.01); *B82Y 30/00* (2013.01); *B82Y 40/00* (2013.01); *C01B 32/176* (2017.08); *H01J 1/304* (2013.01); *H01J 9/025* (2013.01); *H01J 37/32009* (2013.01); *H01J 37/32568* (2013.01); *C01B 2202/34* (2013.01); *H01J 2201/30469* (2013.01); *H01J 2329/0455* (2013.01)

(58) Field of Classification Search
CPC ............... H01J 9/025; H01J 2329/0455; H01J 2201/30469; C01B 32/176
See application file for complete search history.

(56) References Cited

U.S. PATENT DOCUMENTS

| | | |
|---|---|---|
| 6,283,812 B1 | 9/2001 | Jin et al. |
| 6,423,583 B1 | 7/2002 | Avouris et al. |
| 6,777,637 B2 | 8/2004 | Nakayama et al. |

(Continued)

FOREIGN PATENT DOCUMENTS

| | | |
|---|---|---|
| CN | 101298315 A | 11/2008 |
| CN | 101540285 A | 9/2009 |

(Continued)

OTHER PUBLICATIONS

Arnold, M.S., et al., "Enrichment of Single-Walled Carbon Nanotubes by Diameter in Density Gradients," Nano Letters, vol. 5, No. 4, pp. 713-718 (Mar. 12, 2005).

(Continued)

*Primary Examiner* — Sean Michalski (57) ABSTRACT

A method for manufacturing a carbon nanotube (CNT) of a predetermined length is disclosed. The method includes generating an electric field to align one or more CNTs and severing the one or more aligned CNTs at a predetermined location. The severing each of the aligned CNTs may include etching the predetermined location of the one or more aligned CNTs and applying a voltage across the one or more etched CNTs.

20 Claims, 6 Drawing Sheets

(51) Int. Cl.
  *H01J 1/304* (2006.01)
  *H01J 9/02* (2006.01)

(56) References Cited

U.S. PATENT DOCUMENTS

| | | | |
|---|---|---|---|
| 6,998,358 B2 | 2/2006 | French et al. | |
| 7,151,209 B2 | 12/2006 | Empedocles et al. | |
| 7,914,358 B2* | 3/2011 | Wei | H01J 1/304 423/447.1 |
| 8,237,344 B2* | 8/2012 | Wei | H01J 1/3044 313/495 |
| 8,268,398 B2* | 9/2012 | Liu | B82Y 30/00 204/192.1 |
| 9,126,836 B2* | 9/2015 | Lee | B82Y 30/00 |
| 2003/0186625 A1* | 10/2003 | Nakayama | B82Y 10/00 451/28 |
| 2005/0244326 A1* | 11/2005 | Colbert | B82Y 10/00 423/447.1 |
| 2006/0065887 A1* | 3/2006 | Tiano | B82Y 10/00 257/20 |
| 2006/0133107 A1* | 6/2006 | Chen | B82Y 10/00 362/611 |
| 2007/0075619 A1* | 4/2007 | Jiang | H01J 1/304 313/336 |
| 2009/0117674 A1* | 5/2009 | Wei | H01J 1/304 438/20 |
| 2009/0117808 A1* | 5/2009 | Wei | H01J 9/025 445/6 |
| 2009/0236961 A1* | 9/2009 | Wei | H01J 1/304 313/311 |
| 2009/0239072 A1* | 9/2009 | Wei | B81C 1/00111 428/402 |
| 2010/0039015 A1* | 2/2010 | Liu | H01J 1/14 313/306 |
| 2010/0284898 A1 | 11/2010 | Ziegler et al. | |

FOREIGN PATENT DOCUMENTS

| | | |
|---|---|---|
| JP | 2003266399 A | 9/2003 |
| JP | 2005075711 A | 3/2005 |
| JP | 2005126254 A | 5/2005 |
| JP | 2005522340 A | 7/2005 |
| JP | 2006521213 A | 9/2006 |
| JP | 2007253270 A | 10/2007 |
| WO | 2004076049 A2 | 9/2004 |
| WO | 2008082609 A2 | 7/2008 |
| WO | 2009032090 A1 | 3/2009 |

OTHER PUBLICATIONS

Arnold, M.S., et al., "Sorting carbon nanotubes by electronic structure using density differentiation," Nature Nanotechnology, vol. 1, pp. 60-65 (Oct. 4, 2006).

Chen, X.Q., et al., "Aligning single-wall carbon nanotubes with an alternating-current electric field," Applied Physics Letters, vol. 78, No. 23, pp. 3714-3716 (Jun. 4, 2001).

Chen, Z., et al. "Bulk Separative Enrichment in Metallic or Semiconducting Single-Walled Carbon Nanotubes," Nano Letters, vol. 3, No. 9, pp. 1245-1249 (Aug. 20, 2003).

Collins et al., "Engineering Carbon Nanotubes and Nanotube Circuits Using Electrical Breakdown," Science, vol. 292, No. 5517, pp. 706-709 (Apr. 27, 2001).

Guo et al., "Covalently Bridging Gaps in Single-Walled Carbon Nanotubes with Conducting Molecules," Science, vol. 311, No. 5759, pp. 356-359 (Jan. 20, 2006).

Hayamizu, Y., et al., "Integrated three-dimensional microelectromechanical devices from processable carbon nanotube wafers," Nature Nanotechnology, vol. 3, pp. 289-294 (May 4, 2008).

International Search Report for International Patent Application No. PCT/KR/2010/009305 dated Feb. 22, 2011.

Jin, C., et al., "Plumbing carbon nanotubes", Nature Nanotechnology, vol. 3, pp. 17-21, (Jan. 2008).

Kang, S.J., et al., "High-performance electronics using dense, perfectly aligned arrays of single-walled carbon nanotubes," Nature Nanotechnology, vol. 2, pp. 230-236 (Apr. 2007).

Kumar, et al., "DC electric field assisted alignment of carbon nanotubes on metal electrodes," Solid-State Electronics, vol. 47, Issue 11, pp. 2075-2080 (Nov. 2003).

Kurihara, K., et al., "Low-cost MEMS Fabrication Technology Using a Replica Molding Technique," Translation of AIST press release, pp. 1-4 (Nov. 21, 2012).

Li, D., et al., "Collecting Electrospun Nanofibers with Patterned Electrodes," Nano Letters, vol. 5, No. 5, pp. 913-916, (Apr. 9, 2005).

Lustig et al., "Lithographically Cut Single-Walled Carbon Nanotubes: Controlling Length Distribution and Introducing End-Group Functionality," Nano Letters, vol. 3, No. 8, pp. 1007-1012 ( Jun. 25, 2003).

Park et al., "Electrical cutting and nicking of carbon nanotubes using an atomic force microscope," Applied Physics Letters, vol. 80, No. 23, pp. 4446-4448 (Jun. 10, 2002).

Zhang, G., et al., "Selective Etching of Metallic Carbon Nanotubes by Gas-Phase Reaction," Science, vol. 314, pp. 974-977 (Nov. 10, 2006).

Ziegler et al., "Controlled Oxidative Cutting of Single-Walled Carbon Nanotubes," Journal of the American Chemical Society, vol. 127, No. 5, pp. 1541-1547 (Jan. 15, 2005).

Office Action from U.S. Appl. No. 12/648,110 dated Oct. 12, 2011.
Notice of Allowance from U.S. Appl. No. 12/648,110 dated Dec. 27, 2011.
Office Action from U.S. Appl. No. 12/648,110 dated Aug. 15, 2014.
Office Action from U.S. Appl. No. 12/648,110 dated Feb. 26, 2015.
Notice of Allowance from U.S. Appl. No. 12/648,110 dated Apr. 29, 2015.

* cited by examiner

DEVICES FOR CARBON NANOTUBE LENGTH CONTROL

CROSS-REFERENCE TO RELATED APPLICATIONS

This application is a division of U.S. application Ser. No. 12/648,110 filed on 28 Dec. 2009, the disclosure of which is incorporated herein, in its entirety, by this reference.

BACKGROUND

Carbon nanotubes (CNTs) are carbon allotropes consisting of carbon found in abundance all over the world. CNTs are formed in such a manner that one carbon element is bonded to other carbon elements while making a hexagonal honeycomb-pattern in a tube-shape. The diameter of a CNT is in the order of a few nanometers. Recently, CNTs have been proposed as a basic element for the next generation of nanoelectronic, mechanical and nanomedical systems due to their nanoscale dimensions and outstanding materials properties, such as ballistic electronic conduction, immunity from electromigration effects at high current densities, and transparent conduction. However as commonly synthesized, CNTs vary in their diameter and chiral angle, and these physical variations may result in changes in their electronic and/or optical behavior.

SUMMARY

In one aspect, a method for manufacturing a carbon nanotube (CNT) of a predetermined length includes generating an electric field to align one or more CNTs and severing the one or more aligned CNTs at a predetermined location. The aligned CNTs may be severed by etching the predetermined location of the one or more aligned CNTs and applying a voltage across the one or more etched CNTs.

In another aspect, a device for manufacturing a carbon nanotube (CNT) of a predetermined length, includes at least one pair of source and drain electrodes to align the CNTs between the source and drain electrodes, and an electronic device to generate an electric field between the source and drain electrodes to align the one or more CNTs located between the source and drain electrodes, and to apply a voltage to sever the one or more CNTs at a predetermined location.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Device for Manufacturing a Carbon Nanotube (CNT) of a Predetermined Length

In one aspect, a device for manufacturing a carbon nanotube (CNT) of a predetermined length is provided. As used herein, the "carbon nanotubes (CNTs)" refer to allotropes of carbon with a cylindrical nanostructure. The CNTs may be single-walled or multi-walled. Single-walled CNTs refer to CNTs in which one-atom-thick layer of graphite is wrapped into a cylinder, and multi-walled CNTs refer to CNTs in which multiple sheets of graphite are arranged in concentric cylinders. The predetermined length of CNTs may refer to a desired length of CNTs depending on their use and/or application. For example, CNTs of relatively longer length may be used for a flat display, such as a field emission display (FED), and CNTs of shorter length may be used for a super capacitor. The predetermined length of each CNT can be in the range of approximately 1-500 µm, approximately 10-400 µm, or approximately 100-250 µm.

In the present disclosure, the CNTs can be fabricated using, without limitation, a chemical vapor deposition (CVD), arc discharge, or laser ablation, which are well-known in the art. By way of example, CNTs are grown using chemical vapor deposition (CVD) by placing iron catalysts in lithographically patterned stripes approximately 50-100 µm apart on a substrate. The CNTs can be grown from the catalyst stripes to the catalyst stripes such that the CNTs are formed between the catalyst stripes. For additional detail on growing CNTs using CVD, see Seong Jun Kang, et al., "High-performance electronics using dense, perfectly aligned arrays of single-walled carbon nanotubes", nature nanotechnology, 25 Mar. 2007, 230-236, Vol. 2., 2007 Nature Publishing Group, which is incorporated by reference herein in its entirety.

Figure 1:
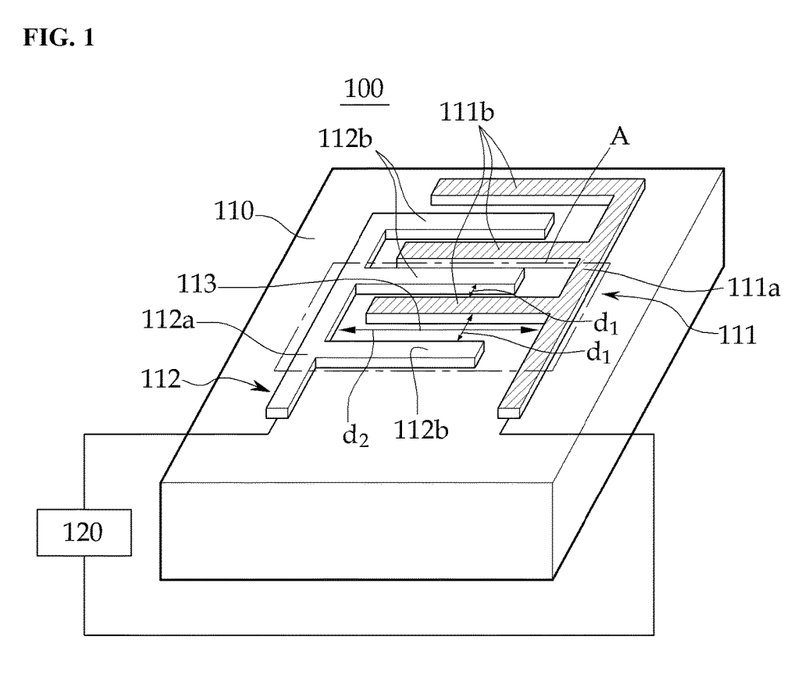
FIG. 1 is a schematic diagram of an illustrative embodiment of a device for manufacturing carbon nanotubes (CNTs) of a predetermined length.

FIG. 1 is a schematic diagram of an illustrative embodiment of a device 100 for manufacturing CNTs of a predetermined length. FIG. 1 shows the device 100 including at least one pair of source and drain electrodes 111 and 112 on a substrate 110. The source electrode 111 is represented by slashed lines to distinguish the source electrode 111 from the drain electrode 112 clearly. The substrate 110 is configured to support one or more CNTs. In some embodiments, the substrate 110 may be a quartz wafer, silicon (S), silicon carbide (SiC), silicon germanium (SiGe), gallium arsenide (GaAs), or a sapphire wafer on which the CNTs are aligned. The substrate 110 is not limited to the illustrated embodiment of FIG. 1, but can have any configuration, such as flat rectangular or square type, as long as it can support one or more CNTs.

As depicted in FIG. 1, the device 100 includes at least one pair of the source and drain electrodes 111 and 112, and an electronic device 120 operably (for example, electrically) connected to the source and drain electrodes 111 and 112. The electronic device 120 is configured to generate an electric field between the source and drain electrodes 111 and 112 to align one or more CNTs located between the source and drain electrodes 111 and 112. For example, the electronic device 120 may apply a voltage to the drain electrode 112, and the electric filed may be generated across the CNTs due to the voltage difference between the source and drain electrodes 111 and 112. As used herein, the term, "electric field" refers to an electrical energy with energy density proportional to the square of the field intensity, which may exert a force on other electrically charged objects. The CNTs can be arranged along with the direction of the generated electric field, which will be described in detail later. As examples of the electronic device 120, a voltage source, such as a LED voltage source or a Zener voltage source can be used. The electronic device 120 can control an amount of the voltages provided to the drain electrode 112 to align the CNTs. In some embodiments, the electronic device 120 can be controlled to apply to the drain electrode 112 approximately AC 1-100V, or approximately AC 10-50 V.

Figure 4A:
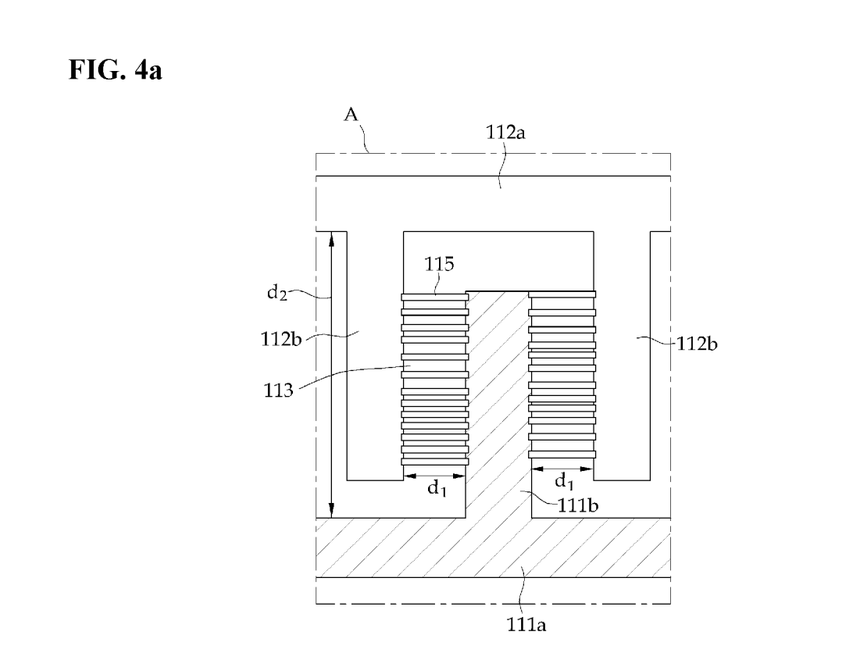
FIGS. 4(a) and 4(b) illustrate top views of the portion "A" of the device of FIG. 1 for illustrating an aligning and etching process in accordance with one example.
Figure 4B:
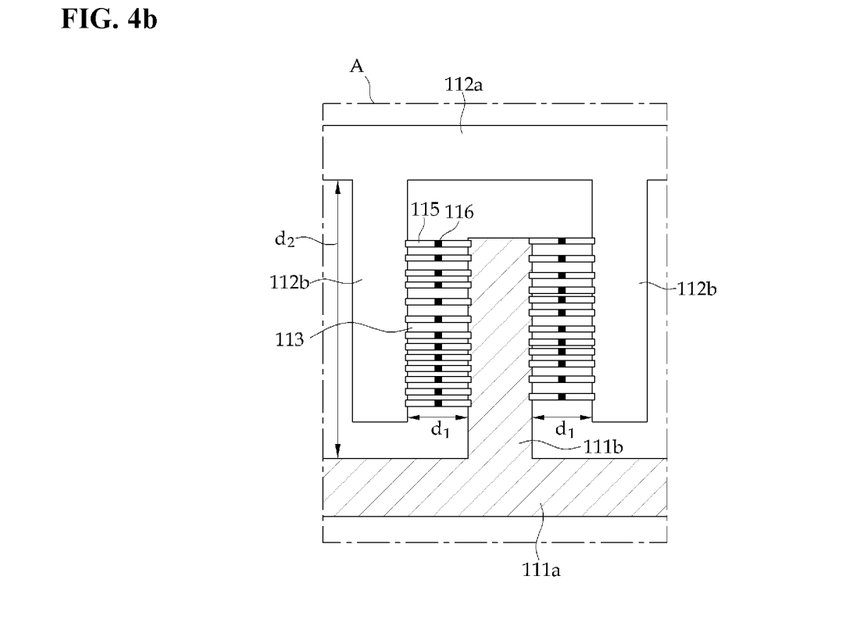

The electronic device 120 is further configured to apply a voltage to sever the one or more CNTs at a predetermined location. As used herein, the term "severed" or "sever" refers to a physical separation (for example, split or cut) of CNTs. The "predetermined location" refers to a desired location of CNTs to be severed. The predetermined location of CNTs will be described in detail in conjunction with FIG. 4. The source and drain electrodes 111 and 112 can be arranged to align the CNTs therebetween and can be composed of any conductive material, such as well known semiconductor material having conductivity, or a metal.

The source electrode 111 and the drain electrode 112 can be located on the substrate 110 to make at least one alignment area 113. As used herein, the term "alignment area" refers to an area to align the one or more CNTs. The term "alignment area" further refers to an area to receive the one or more CNTs. The term "alignment area" still further refers to an area formed between the source electrode 111 and the drain electrode 112. The term "alignment area" still further refers to an area to receive an electric field generated between the source and drain electrodes 111 and 112 in response to a voltage of the electronic device 120. The function and size of the alignment 113 will be described in detail hereinafter.

In an illustrative embodiment, the source electrode 111 can be configured to have a main portion 111a and one or more branched portions 111b extended from the main portion 111a. The drain electrode 112 can be configured to have a main portion 112a and one or more branched portions 112b extended from the main portion 112a. The source and drain electrodes 111 and 112 can be located on the substrate 110 such that the alignment area 113 can be formed between the branched portions 111b and 112b of the source and drain electrodes 111 and 112.

Herein, the main portions 111a and 112a of the source and drain electrodes 111 and 112 refer to an extending portion in one direction (for example, in a longitudinal direction), respectively. The branched portions 111b and 112b of the source and drain electrodes 111 and 112 refer to portions branched out from the main portions 111a and 112a in perpendicular to the main portions 111a and 112a, respectively. As depicted in FIG. 1, the branched portions 111b and 112b may be horizontally branched from the main portions 111a and 112a, respectively. Although FIG. 1 illustrates three (3) branched portions 111b of the source electrode 111 and three (3) branched portions 112b of the drain electrode 112, it will be apparent to one of skill in the art that more than three (3) branched portions can be branched out from the main portions 111a and 112a, respectively.

FIG. 1 further illustrates that the branched portions 111b of the source electrode 111 and the branched portions 112b of the drain electrode 112 may be alternately arranged on the substrate 110, with a predetermined distance "d1" to provide the alignment area 113 between the source and drain electrodes 111 and 112. The predetermined distance "d1" and the alignment area 113 will be described in detail with reference to FIG. 3 hereinafter.

Although FIG. 1 illustrates the source and drain electrodes 111 and 112 which form a maze-like pattern in which the branched portions 111b and 112b of the source electrode 111 and the drain electrode 112 are alternately arranged on the substrate 110, it will be apparent to those of skilled in the art that the source and drain electrodes 111 and 112 can have various configurations to provide the alignment area 113 on the substrate 110.

Figure 2A:
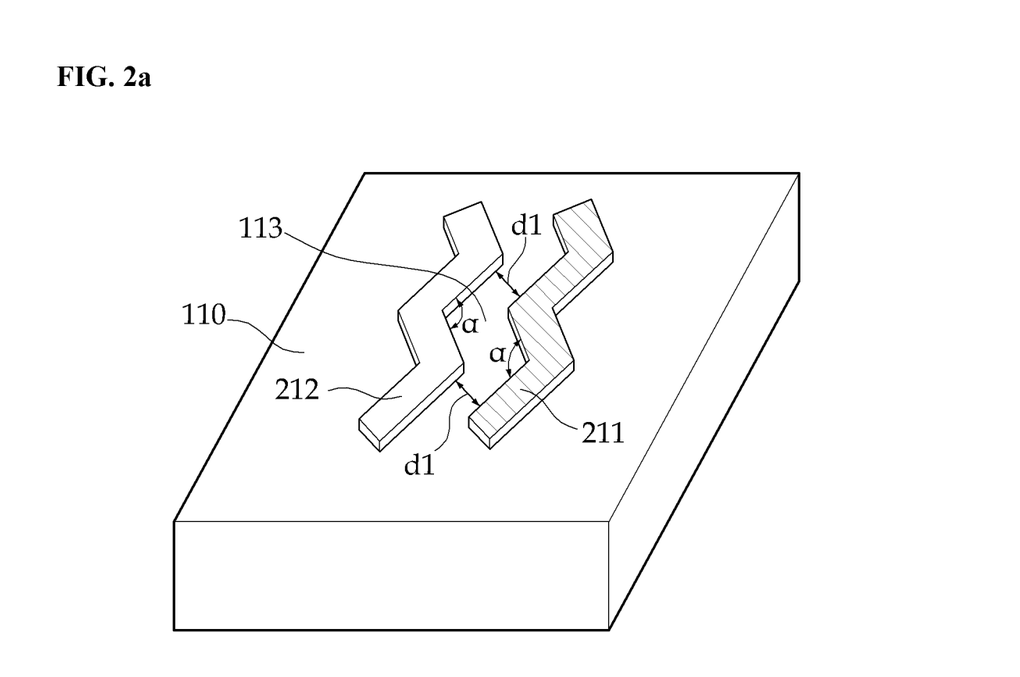
FIGS. 2(a) and 2(b) illustrate schematic diagrams of another illustrative embodiment of a device for manufacturing CNTs of a predetermined length.

As one embodiment, FIG. 2(a) illustrates that a source electrode 211 and a drain electrode 212 each having a zigzag-type structure are arranged on the substrate 110 with the predetermined distance "d1" to provide the alignment area 113. Each of the source electrode 211 and the drain electrode 212 forms the zigzag-type structure by having multiple numbers of corners with a predetermined angle "α." By way of example, the predetermined angle α can be about 90 degrees (°) to 180 degrees (°) or about 120 degrees (°) to 150 degrees (°).

Figure 2B:
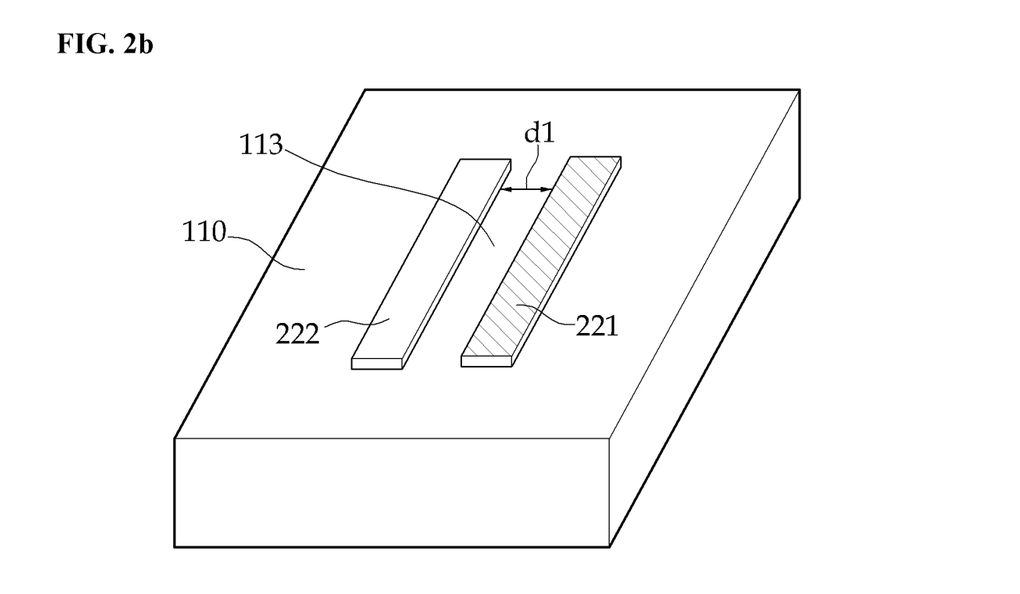

As another embodiment, FIG. 2(b) illustrates that a source electrode 221 and a drain electrode 222 having a bar-type structure are arranged in parallel on the substrate 110 with the predetermined distance "d1" to provide the alignment area 113. Although the maze-like pattern, the zigzag pattern and the parallel bar pattern are illustrated, it will be apparent to one of skill in the art that various patterns of the source and drain electrodes can be configured to provide the alignment area 113 within the scope of the present disclosure.

Figure 3:
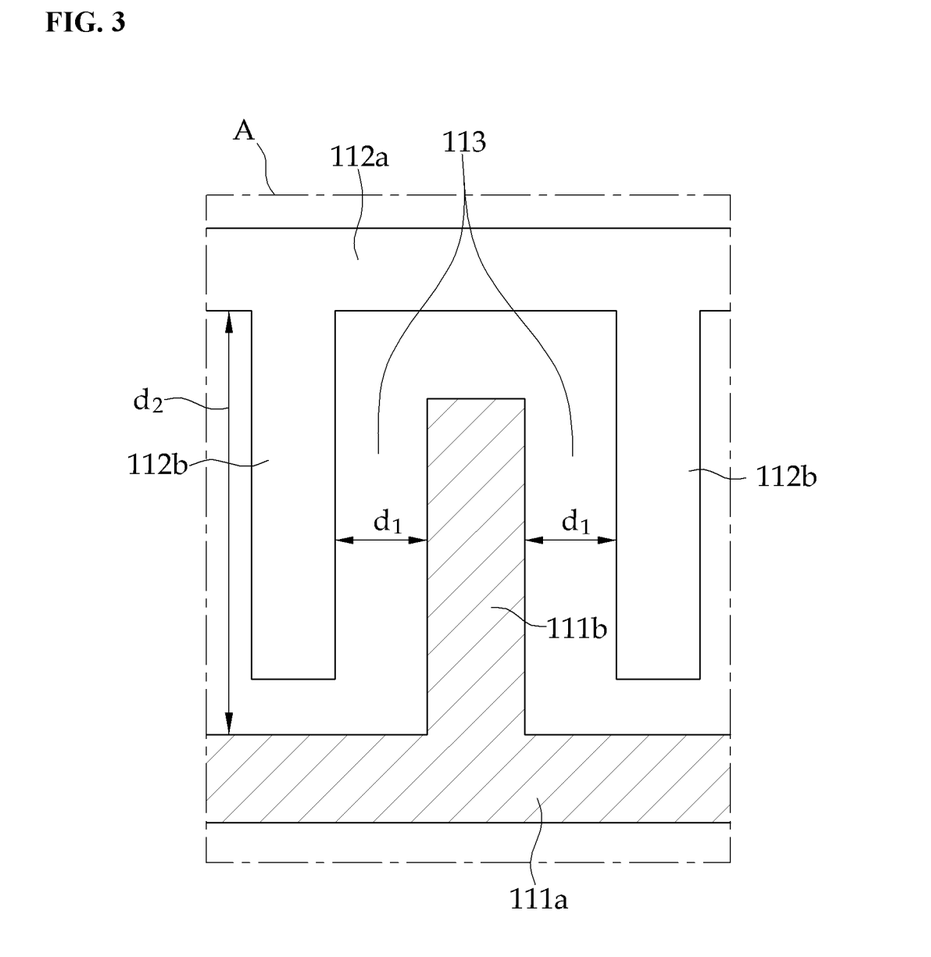
FIG. 3 is a schematic diagram illustrating a top view of the portion "A" of the device shown in FIG. 1.

FIG. 3 is a schematic diagram illustrating a top view of the portion "A" of the device shown in FIG. 1. FIG. 3 illustrates the alignment area 113 defined by the main portions 111a and 112a, and the branched portions 111b and 112b of the source and drain electrodes 111 and 112. Particularly, a width of the alignment area 113 can be determined by a predetermined distance "d1" between the branched portions 111b and 112b of the source and drain electrodes 111 and 112. As used herein, the predetermined distance "d1" also refers to a length equal to or greater than a length of CNTs to be aligned on the alignment area 113, which will be described in detail hereinafter. A length of the alignment area 113 can be determined by a distance "d2" between the main portions 111a and 112a of the source and drain electrodes 111 and 112. For example, the predetermined distance "d1" between the branched portions 111b and 112b can be about 2-1000 µm, about 20-800 µm, or about 200-500 µm. The distance "d2" between the main portions 111a and 112a can be about 10-5000 µm, about 100-4000 µm, or about 1000-2500 µm. Accordingly, the size of the alignment 113 can be controlled by the predetermined distance "d1" and the distance "d2." By way of example, if the predetermined distance "d1" between the branched portions 111b and 112b is longer, the width of the alignment area 113 is wider so that longer CNTs can be aligned on the alignment area 113. Further, if the distance "d2" between the main portions 111a and 112a is longer, the length of the alignment area 113 is longer so that a large number of the CNTs can be aligned on the alignment area 113.

In some embodiments, the predetermined distance "d1" between the branched portion 111b and the branched portion 112b may be determined based on a desired length of the one or more CNTs which are aligned in the alignment area 113. Because the one or more CNTs aligned in the alignment area 113 are severed into two segments through a severing process which will be described hereinafter, the predetermined distance "d1" can be determined considering the desired length of the CNTs. Assuming that the desired length of a CNT is 10 µm and the CNT is severed into two segments, the predetermined distance "d1" is about 20 µm. However, the predetermined distance "d1" can be a little longer than 20 µm to consider the loss of length of the CNT during the severing process.

The device 100 can further include an etching device (not shown) to etch the predetermined locations of the aligned CNTs. The etching device of device 100 may include any etching device suitable to etch CNTs, such as, a plasma etching device or reactive ion etching (RIE) device. By way of an example, the plasma etching device may include a plasma chamber, a gas input, gas evacuation holes, a top electrode connected to radio-frequency (RF) source, a bottom electrode connected to a ground. A plasma etching can be performed by ionizing a gas mix, for example, oxygen-containing gas, inside the plasma chamber to obtain ions. The ionization of the gases is done by RF excitation emitted by the top electrode and resulting ions react with the target material, for example, a CNT layer with a masked portion, which is placed on the bottom electrode.

In addition, the device 100 can further include a separator to separate CNTs in accordance with a diameter of the CNTs. The separator can include a centrifugation device, such as an ultracentrifugation device, a low speed centrifugation device, or a high speed centrifugation device. The centrifugation device may sort the CNTs based on the difference in buoyant densities of the CNTs, the diameters in density gradients, or electronic types of the CNTs. Additional details on the separation will be described in connection with FIG. 7.

Method for Manufacturing a Carbon Nanotube (CNT) of a Predetermined Length

FIG. 4(a) illustrates a top view of the boxed portion "A" shown in FIG. 1 for illustrating an alignment of one or more CNTs. In one embodiment, a CNT solution containing one or more CNTs 115 can be provided in the alignment area 113 of the substrate 110 by adding to the alignment area 113 the CNT solution, pouring to the alignment area 113 the solution, immersing the substrate 110 having the alignment area 113 in the CNT solution, soaking the substrate 110 having the alignment area 113 in the CNT solution, supplying to the alignment area 113 the CNT solution, or injecting the CNT solution into the alignment area 113 of the substrate 110 using any type of liquid injector. Herein, the one or more CNTs 115 can be fabricated using well known techniques, such as a CVD, arc discharge or large ablation, as described above. In some embodiments, when the one or more CNTs 115 are grown using CVD technique, the CNTs 115 can have the substantially same length by patterning the CNTs 115 to have the same length using a photolithographic method. As used herein, the CNT solution is formed by dispersing the CNTs 115 into water or other solvents, such as hydrocarbons, halogenated hydrocarbons, ethers, nitrogen compounds and sulfur compounds, without limitation. The CNTs 115 may have diameters of about 1-20 nm, 5-15 nm, or 8-10 nm, and lengths of about 2-1000 µm, about 20-800 µm, or about 200-500 µm.

In some embodiments, a size (for example, a width) of the alignment area 113 may be determined by the predetermined distance "d1," as described above. The predetermined distance "d1" may be substantially equal to or larger than the length of the CNTs 115. Thus, if the CNT solution may be poured on the alignment area 113 of the substrate 110, the CNTs 115 contained in the CNT solution can be provided in the alignment area 113. Here, the CNTs 115 may be dispersed in the alignment area 113. The dispersed CNTs may be aligned in the alignment area 113 in response to an electric field. Particularly, the electronic device 120 (shown in FIG. 1) may apply to the source and drain electrodes 111 and 112 a voltage to generate an electric field between the branched portion 111b of the source electrode 111 and the branched portion 112b of the drain electrode 112. FIG. 4(a) illustrates that in response to the electric field, the CNTs 115 dispersed in the alignment area 113 can be aligned in parallel to the electric field in the alignment area 113 due to electrostatic forces acting on the CNTs 115.

The CNTs 115 aligned in the alignment area 113 can be severed into two segments at predetermined locations. In some embodiments, the CNTs 115 can be severed by etching the predetermined locations of the aligned CNTs, and applying a voltage across the CNTs to cut the etched predetermined locations of the CNTs. Accordingly, the CNTs can be severed into two segments through the etching and the cutting of the CNTs at the predetermined locations of the CNTs. The severing process will be described in detail hereinafter.

FIG. 4(b) illustrates the aligned CNTs 115 with predetermined locations 116 that is subject to an etching process. The predetermined locations 116 can be determined to obtain a desired length of severed segments of the CNTs 115. For example, if each of the CNTs 115 is severed into two segments and each segment has the same desired length, the predetermined location 116 can be located at a middle of a total length of each of the CNTs 115.

Figure 5A:
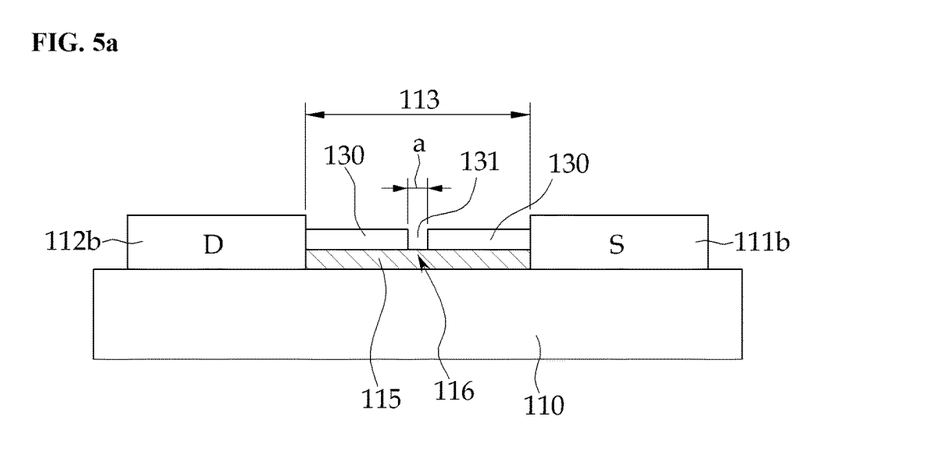
FIGS. 5(a) and 5(b) illustrate schematic diagrams showing a cross-section of the device shown in FIG. 1 for illustrating an etching process.
Figure 5B:
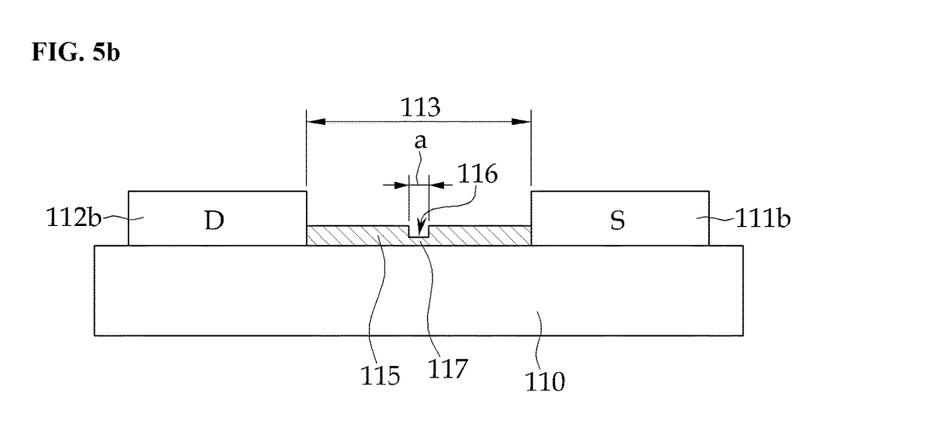

FIG. 5(a) and FIG. 5(b) are schematic diagrams showing an illustrative embodiment of a cross-section of the device shown in FIG. 1 for illustrating the etching process. The predetermined locations 116 of the CNTs 115 are subject to an etching process by the etching device (not shown), such as a plasma etching device or a reactive ion etching (RIE) device. In order to etch the predetermined locations 116 of the CNTs 115, a mask layer 130 can be formed on the CNTs 115 aligned in the alignment area 113, as shown in FIG. 5(a). FIG. 5(a) shows, the substrate 110 on which at least one alignment area 113 is formed between the branched portion 111b of the source electrode and the branched portion 112b of the drain electrode, and one or more CNTs 115 aligned in the alignment area 113. The mask layer 130 having a slit 131 may be deposited to cover the CNTs 115. The slit 131 (i.e. an unmasked portion of mask layer 130) has a width "a" which is substantially the same as that of the predetermined location 116 of the CNTs 115. FIG. 5(a) further shows that the mask layer 130 is deposited on the substrate 110 such that the slit 131 is placed on the predetermined location 116 of the CNTs 115.

In some embodiments, the portions of the CNTs 115 exposed through the slit 131 of the mask layer 130 are available for etching, for example, directional etching. As used herein, the term "directional etching" refers to directional removal of a material from a substrate via a physical or a chemical process using an etchant substance. The etchant substance may be a corrosive liquid or a chemically active ionized gas (for example, a plasma). The directional etching can include, without limitation, an oxygen plasma etching or a reactive ion etching (RIE). For example, the oxygen plasma etching can be performed by ionizing a gas mix, for example, oxygen-containing gas, inside the plasma chamber to obtain ions. The ionization of the gases is done by RF excitation emitted by the top electrode and resulting ions react with a target material, for example, a CNT layer with a masked portion, which is placed on the bottom electrode. In addition, the reactive ion etching (RIE) is an etching technology which uses a chemically reactive plasma to remove a desired portion of a material (for example, CNTs). The plasma is generated under low pressure (vacuum) by an electromagnetic field. High-energy ions from the plasma react with the material such that the desired portion of the material is removed.

As a result of the directional etching performed on the predetermined locations 116 of the CNTs 115, only the unmasked portions having the width of "a" are etched directionally, and thus etched portions 117 having width of "a" are formed in the middle of the lengths of the CNTs 115 as illustrated in FIG. 5(b).

Figure 6:
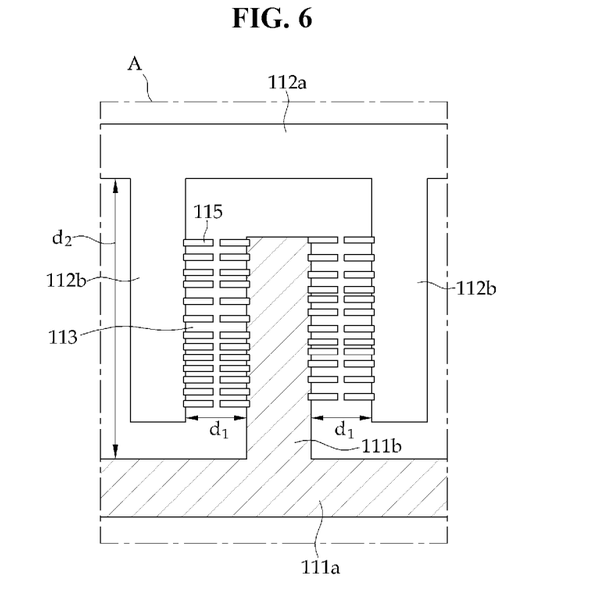
FIG. 6 is a top view of the portion "A" of the device of FIG. 1 for illustrating a severing process in accordance with one example.

FIG. 6 shows the severing of the etched portions 117 of the CNTs 115. FIG. 6 is a top view of the boxed portion "A" of FIG. 1 for illustrating the severing process in accordance with one example. The etched portions 117 (shown in FIG. 5(b)) of the CNTs 115 can be cut in response to the electric field generated between the source electrode 111 and the drain electrode 112 (for example, the branched portion 111b of the source electrode 111 and the branched portion 112b of the drain electrode 112 as depicted in FIG. 1). The electric field can be generated by applying a voltage through the electronic device 120 (shown in FIG. 1). In some embodiments, a voltage is applied from the electronic device 120 to the drain electrode 112, and thus a current is introduced through the CNTs 115. For example, the voltage may be ranged in about 2-2.5 V, about 1-5 V, or about 0.5-10 V, and the current may be ranged in about 10-15 µA, about 5-30 µA, or about 2.5-60 µA. The range of the applied voltage to sever the etched portions 117 of the CNTs 115 can be experimentally obtained based on diameters of the CNTs 115. The range of the introduced current may vary with the applied voltage. In response to the introduced current, the etched portions 117 of the CNTs 115 are weaken, and the CNTs 115 are ultimately severed into two segments with respect to the etched portions 117.

Each of the severed segments of the CNTs 115 may have a length in the range of approximately 1-500 µm, 10-400 µm, or 100-250 µm. The severed segments of the CNTs 115 may have substantially the same length or different length depending on the predetermined locations of the CNTs 115. In some embodiments, when each of the CNTs 115 has one predetermined location 116 and the predetermined location 116 is located on the middle of the total length of each of the CNTs 115, the severed segments of the CNTs 115 have substantially the same length. In another embodiment where the predetermined location 116 is placed on one third of the total length of each of the CNTs 115, each of the CNTs 115 may have one segment having one third of the total length of each CNT and the other segment having two third of the total length of each CNT.

Figure 7:
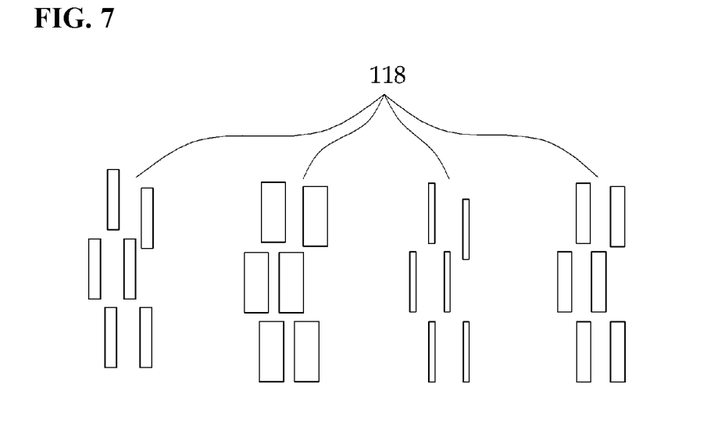
FIG. 7 is a schematic diagram of illustrative severed segments of CNTs with the same or substantially similar diameters.

FIG. 7 is a schematic diagram illustrating groups of severed segments 118 of the CNTs 115 of FIG. 6 with the same or substantially similar diameters. The severed segments 118 of the CNTs 115 may be detached from the substrate 110 (shown in FIG. 1), and the detached segments 118 of the CNTs having various diameters may be sorted a centrifugation. As an example of the centrifugation, an ultracentrifugation using density differentiation can be used. For example, in response to a centripetal force, the severed segments 118 having different diameters can be separated in different layers of a centrifuge tube according to the difference in buoyant densities. Herein, the buoyant densities may refer to mass per volume of the CNTs. The group of the severed segments 118 with smaller diameters can be placed in a higher layer in the centrifuge tube and the group of the severed segments 118 with larger diameters can be placed in a lower layer in the centrifuge tube. Thus, the layer by layer removal from the centrifuge tube can be performed to extract each layer. For example, by removing a highest layer from the centrifuge tube, the severed segments 118 of the CNTs 115 with smallest diameters can be extracted. Additional details on the sorting method using the difference in buoyant densities, see "Sorting carbon nanotubes by electronic structure using density differentiation," by Michael S. Arnold et al., Nature nanotechnology, vol 1, published on October 2006, which is incorporated by reference herein in its entirety.

In other sorting methods, the CNTs 115 can be classified according to their diameters in density gradients, or electronic types. Additional details on the sorting method using diameters in density gradients, and electronic types, see "Enrichment of single-walled carbon nanotubes by diameter in density gradients," by Arnold, M. S. et al., Nano Lett. 5, 713-718 (2005); and "Bulk separative enrichment in metallic or semiconducting single-walled carbon nanotubes," by Chen, Z. H. et al., Nano Lett. 3, 1245-1249 (2003), which are incorporated by reference herein in their entireties.

In another embodiment, the sorting of the CNTs 115 according to their diameters can be performed prior to the severing process. For example, the CNTs 115 having various diameters can be sorted according to their diameters by the aforementioned sorting method, and then the CNTs 115 with the same or similar diameters can undergo the severing process as illustrated with respect to FIGS. 4 to 6.

As illustrated above, one or more CNTs can be severed into two segments with a desired length by etching a predetermined location of the CNTs and applying an electric field to the etched portion of the CNTs. Further, the predetermined location of the CNTs can be controlled to adjust the length of the segments of the CNTs or the number of the segments of the CNTs. Accordingly, the CNTs with the desired length can be manufactured with a simple and cost-effective method.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., " a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device for manufacturing a carbon nanotube (CNT) having a predetermined length, the device comprising:
   at least one pair of first and second electrodes configured to align one or more CNTs between the first and second electrodes;
   an etchant device configured to etch one or more predetermined locations of the one or more CNTs; and
   an electronic device configured to generate an electric field between the first and second electrodes to align the one or more CNTs located between the first and second electrodes, and to apply a voltage to sever the one or more CNTs at the one or more predetermined locations.

2. The device of claim 1, wherein the etchant device is configured to directionally etch the one or more predetermined locations of the one or more CNTs.

3. The device of claim 2, wherein the etchant device is configured to directionally etch by at least one of oxygen plasma etching or reactive ion etching.

4. The device of claim 1, wherein the etchant device is configured to provide a corrosive liquid.

5. The device of claim 1, wherein the electronic device is configured to apply the voltage across the one or more CNTs in order to sever the one or more CNTs at the one or more predetermined locations of each of the one or more CNTs after the one or more CNTs are etched at the one or more predetermined locations.

6. The device of claim 1, wherein the one or more predetermined locations are located at a middle of a total length of each of the one or more CNTs.

7. The device of claim 1, further comprising a separator configured to separate the one or more severed CNTs based on a diameter of the one or more severed CNTs.

8. The device of claim 1, wherein the first and second electrodes are spaced from each other by a distance that is equal to or greater than a length of the one or more CNTs.

9. The device of claim 1, wherein each of the first and second electrodes includes a main portion and one or more branched portions substantially perpendicular to the main portion, such that the one or more branched portions of the first electrode and the second electrode are alternately arranged and are generally uniformly spaced.

10. The device of claim 1, wherein each of the first and second electrodes exhibit a zigzag-type structure.

11. The device of claim 1, wherein each of the first and second electrodes exhibits a bar-type structure that is substantially parallel to each other.

12. A device for manufacturing a carbon nanotube (CNT) of a predetermined length, the device comprising:
at least one pair of first and second electrodes configured to align one or more CNTs between the first and second electrodes;
a source including a CNT solution configured to dispense the CNT solution between the first and second electrodes, the CNT solution including the one or more CNTs;
an etchant device configured to etch one or more features at one or more predetermined locations of the one or more CNTs; and
an electronic device configured to generate an electric field between the first and second electrodes to align the one or more CNTs located between the first and second electrodes, and to apply a voltage to sever the one or more CNTs at the one or more predetermined locations.

13. The device of claim 12, wherein the source including the CNT solution includes a liquid injector configured to inject the CNT solution into an alignment area between the first and second electrodes.

14. The device of claim 12, wherein the one or more severed CNTs have substantially the same length.

15. The device of claim 12, wherein the first and second electrodes are spaced from each other by a distance that is equal to or greater than a length of the one or more CNTs.

16. A device for manufacturing a carbon nanotube (CNT) of a predetermined length, the device comprising:
a substrate;
at least one pair of first and second electrodes positioned on the substrate;
a CNT solution provided on at least a portion of the substrate between the first and second electrodes, the CNT solution including one or more CNTs;
an etchant device configured to etch one or more predetermined locations of the one or more CNTs; and
an electronic device configured to generate an electric field between the first and second electrodes to align the one or more CNTs located between the first and second electrodes, and to apply a voltage to sever the one or more CNTs at the one or more predetermined locations.

17. The device of claim 16, wherein the one or more severed CNTs have substantially the same length.

18. The device of claim 16, wherein the first and second electrodes are spaced from each other by a distance that is equal to or greater than a length of the one or more CNTs.

19. The device of claim 16, further comprising a mask disposed on the one or more CNTs and defining a slit.

20. The device of claim 19, wherein the slit has a width that is substantially the same as the one or more predetermined locations.

* * * * *